(12) United States Patent
Higashida et al.

(10) Patent No.: US 6,328,572 B1
(45) Date of Patent: Dec. 11, 2001

(54) MOTHERBOARD WITH BOARD HAVING TERMINATING RESISTANCE

(75) Inventors: Hiroshi Higashida; Kimiyasu Makino, both of Tokyo (JP)

(73) Assignee: Kel Corporation, Tokyo (JP)

( * ) Notice: Subject to any disclaimer, the term of this patent is extended or adjusted under 35 U.S.C. 154(b) by 0 days.

(21) Appl. No.: 09/626,357

(22) Filed: Jul. 27, 2000

(30) Foreign Application Priority Data

Jul. 28, 1999 (JP) .................................................. 11-213971

(51) Int. Cl.$^7$ .................................................. H01R 12/00
(52) U.S. Cl. .................................................. 439/61; 361/788
(58) Field of Search ........................ 439/61, 65; 361/784, 361/785, 788

(56) References Cited

U.S. PATENT DOCUMENTS

| | | | |
|---|---|---|---|
| 3,992,686 | | 11/1976 | Canning .............................. 333/84 M |
| 4,420,793 | * | 12/1983 | Strandberg ............................ 361/413 |
| 4,498,717 | * | 2/1985 | Reimer .............................. 439/17 LM |
| 4,511,950 | * | 4/1985 | Bunner et al. ....................... 361/413 |
| 4,647,123 | * | 3/1987 | Chin et al. .............................. 439/17 |
| 5,117,331 | | 5/1992 | Gebara .................................. 361/407 |
| 5,391,922 | * | 2/1995 | Matsui .................................. 257/773 |
| 5,525,063 | * | 6/1996 | McMichen et al. ..................... 439/61 |
| 5,530,623 | * | 6/1996 | Sanwo et al. ........................ 361/784 |
| 5,547,386 | * | 8/1996 | Fredberg ................................. 439/61 |
| 5,583,867 | * | 12/1996 | Poole .................................... 370/257 |
| 5,887,158 | * | 3/1999 | Sample et al. ........................ 395/500 |
| 5,896,473 | * | 4/1999 | Kaspari .................................. 385/24 |
| 5,926,378 | * | 7/1999 | DeWitt et al. ......................... 361/788 |
| 6,003,131 | * | 12/1999 | Iee et al. ................................. 713/2 |
| 6,018,867 | * | 2/2000 | Boe ........................................ 29/762 |
| 6,055,157 | * | 4/2000 | Bartilson .............................. 361/699 |
| 6,097,200 | * | 8/2000 | Turlapaty et al. .................... 324/760 |
| 6,111,753 | * | 8/2000 | Singer .................................. 361/719 |
| 6,147,871 | * | 11/2000 | DeWitt et al. ......................... 361/752 |
| 6,163,464 | * | 12/2000 | Iahibashi et al. ..................... 361/788 |
| 6,172,517 | * | 1/2001 | Takekuma et al. ..................... 326/30 |

FOREIGN PATENT DOCUMENTS 0481779 4/1992 (EP) .
0762291 3/1997 (EP) .

OTHER PUBLICATIONS

Copy of INPI Search Report Dec. 19, 2000.

* cited by examiner

*Primary Examiner*—Tulsidas Patel
(74) *Attorney, Agent, or Firm*—Robert W. J. Usher

(57) ABSTRACT

The motherboard $MB_1$ of the present invention is a motherboard comprising a plurality of plug connectors 12 installed on the front face of the board 11 and a bus line for inter-connecting these plug connectors so as to allow inter-communication of daughter boards $DB_1$–$DB_7$ connected to the plug connectors 12. The motherboard is configured such that a termination board $TB_1$ having a terminating resistance to decrease reflection noise of the bus line is connected to the plug connector at the last slot S8 of the bus line among the plug connectors 12, 12, . . . installed on the front face of the motherboard. Alternatively, the motherboard is configured such that the termination board is connected to the rear face of the last slot S8.

3 Claims, 6 Drawing Sheets

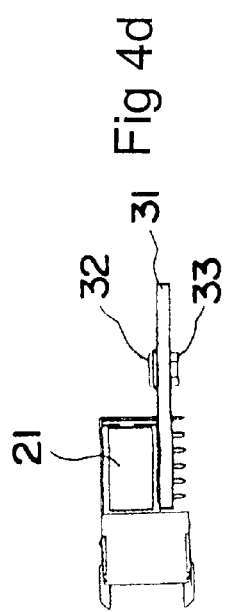
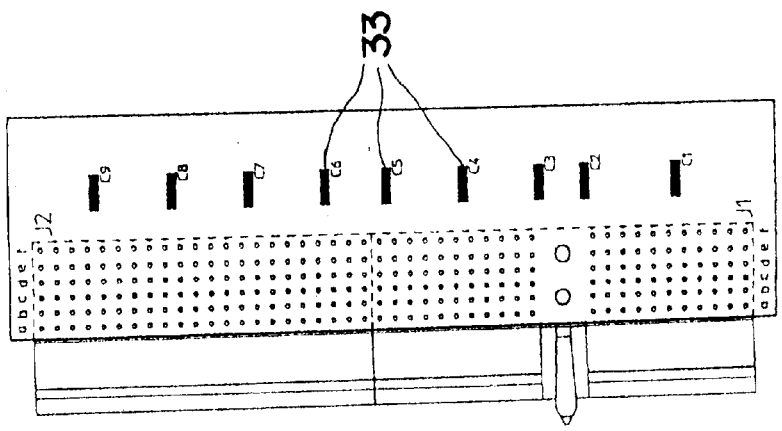
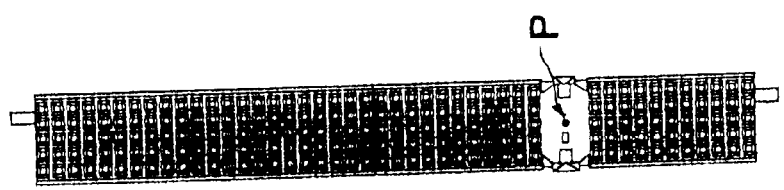
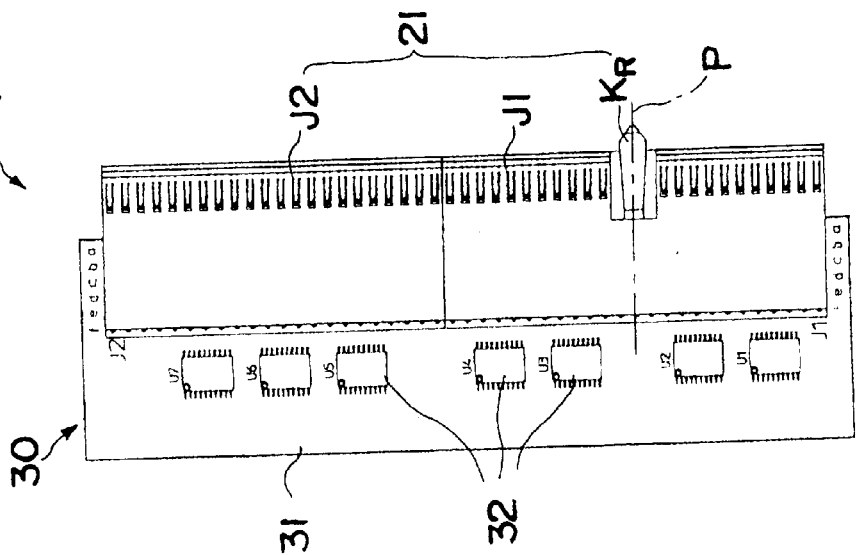

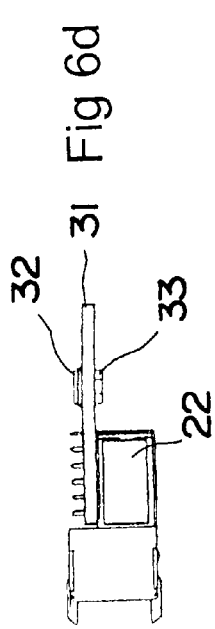
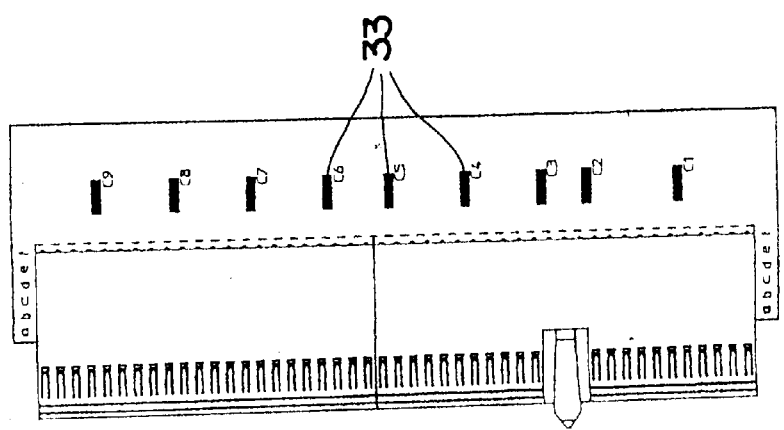
Fig 6d
FIG 6c
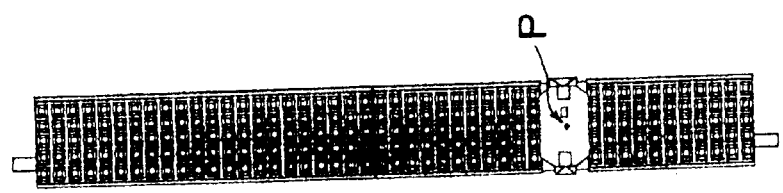
FIG 6a
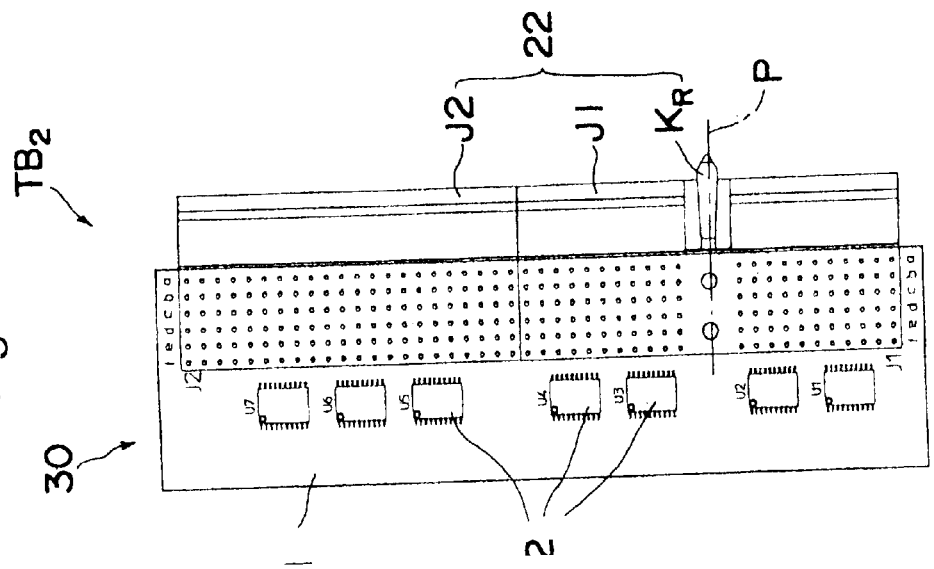
Fig 6b

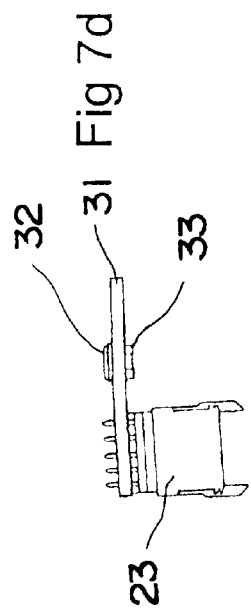
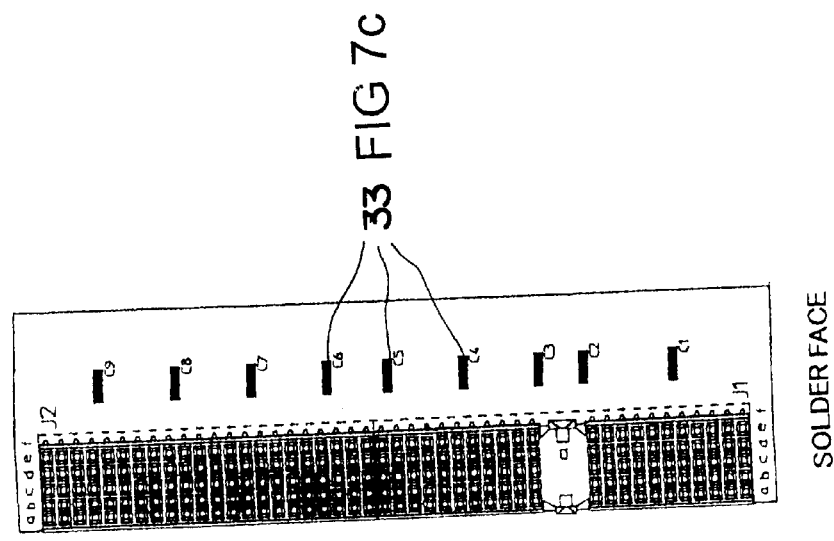
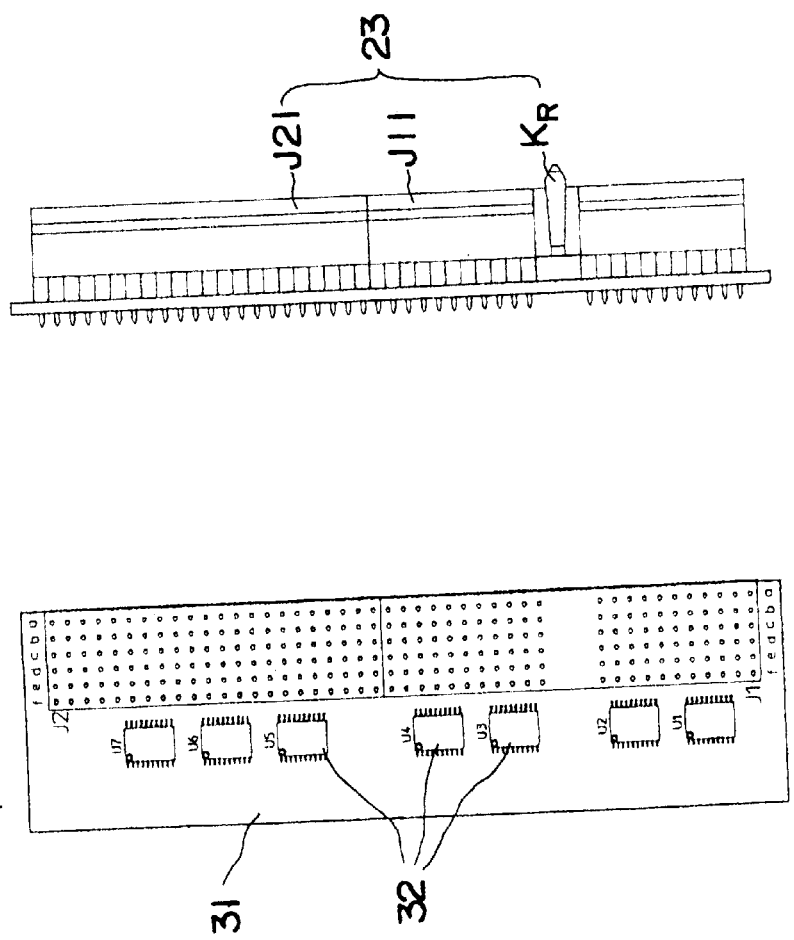
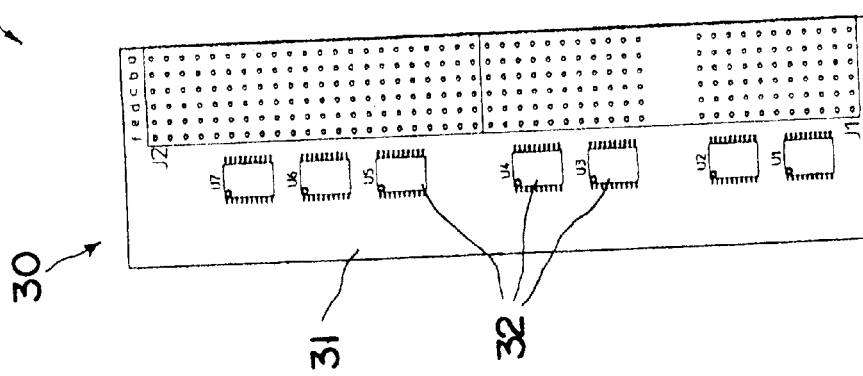

MOTHERBOARD WITH BOARD HAVING TERMINATING RESISTANCE

FIELD OF THE INVENTION

The present invention relates to a control board for industrial equipment where a microcomputer is applied, and more particularly to a configuration of a motherboard for buses which have a bus line between boards having various functions, and the connector structure thereof.

BACKGROUND OF THE INVENTION

A mother board for a bus for connecting many functional boards, such as an I/O board, memory board and CPU board (these boards connected to a motherboard are called "daughter boards") via connectors, and performing communication between these daughter boards are widely used for many industrial equipment including measurement control equipment and medical equipment. The standard for buses used for motherboards have been specified in such industrial standards as the IEEE standard and the ICE standard, and various motherboards for buses, such as a motherboard for a VME BUS and a motherboard for a CPCI BUS conforming to these standards have been commercialized according to the size of the board to be connected and the number of slots.

In such a motherboard for a bus (also called a "backplane" or "backboard"), high frequency control signals flow over a bus line formed on the motherboard. In a recent system, in particular, the number of bits, which is the processing unit of a microcomputer, increased from 16 bits to 32 bits to 64 bits, with control signals increasing in speed and frequency as the reference clock speed increases. As a result, transmitted high frequency signals reflect on the bus line, and this reflection component is superimposed on control signals as noise, interfering with the stable operation of the system. To prevent this in a motherboard for a bus which performs high-speed communication processing, a high-speed Schottky diode array (terminating resistance) is mounted next to the last slot on the bus line to absorb high frequency signals so that reflection noise is not generated on the bus line.

However, mounting the above terminating resistance on a motherboard increases the number of components to be mounted on the motherboard, and as a result, the mounting space of conventional components, such as connectors for board connections, capacitors and terminals, decreases, or the size of the motherboard increases.

A solution to this problem is creating a small board with a terminating resistance in the same way as other daughter boards, and this small board is inserted in the last slot on the motherboard. With this solution, however, a small board with a terminating resistance (termination board) occupies the last slot on the motherboard, which decreases the number of available slots for actual operation.

SUMMARY OF THE INVENTION

It is an object of the present invention to provide a motherboard where a terminating resistance can be installed without decreasing the mounting space of the motherboard or increasing the size of the motherboard.

It is another object of the present invention to provide a motherboard where a terminating resistance can be installed without decreasing the number of available slots.

To achieve these objects, a motherboard according to the present invention comprises a plurality of connector elements (e.g. plug connector 12) installed on a front face of the board and a bus line for inter-connecting these plurality of connector elements, so as to allow inter-connection of a plurality of daughter boards connected to the plurality of connector elements. In the motherboard, a termination board having a terminating resistance to decrease reflection noise of the bus line is connected to the connector element at the last stage of the bus line among the plurality of connector elements installed on the front face of the motherboard.

According to the above configuration, a terminating resistance (high-speed Schottky diode array), which is conventionally installed next to the last slot of a motherboard, is installed on the termination board, and is connected to the connector element at the last stage of the bus line, just like another daughter board. Since the terminating resistance is removed from the motherboard, the mounting space for other components can be increased, or the size of the motherboard can be decreased.

Another motherboard according to the present invention comprises a plurality of connector elements installed on a front face of the board and a bus line for inter-connecting these plurality of connector elements, so as to allow inter-connection of a plurality of daughter boards connected to the plurality of connector elements, just like the above invention. In the motherboard, a connector element (e.g. plug connector 15), where a termination board having a terminating resistance for decreasing the reflection noise of the bus line is connected, is installed on the rear face of the connector element at the last stage of the bus line among the plurality of connector elements installed on the front face of the motherboard.

According to this configuration, a terminating resistance, which is conventionally installed on the motherboard, is installed on the termination board, and the termination board is connected to the connector element installed on the rear face of the connector element at the last stage of the bus line, just like another daughter board. Since the terminating resistance is removed from the motherboard, the mounting space for other components can be increased or the size of the motherboard can be decreased. Also, according to the present configuration, the termination board does not occupy the termination slot mounted on the front face of the motherboard, so all the slots on the front face of the motherboard can be used for connecting daughter boards, therefore slots can be effectively used.

It is preferable that the termination board to be connected to the motherboard is installed such that the component mounting face of the board of the termination board is parallel with the other daughter boards to be connected to the motherboard. According to this configuration, the termination board is installed parallel with the other daughter boards, so the termination board does not interfere with mounting the other daughter boards, and the dimension in the width direction (dimension in the array direction of the plurality of slots) of the system having this motherboard can be decreased, and a compact system can be provided.

When the connection terminal of the termination board is installed on the rear face of the motherboard, it is preferable that the termination board to be connected to the motherboard is configured such that the component mounting face of the board of the termination board is parallel with the motherboard. According to this configuration, the termination board does not protrude to the rear face side of the motherboard, therefore the dimension in the depth direction to the rear face side of the motherboard (thickness direction of the system) can be decreased, and a compact system can be provided.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein:

FIGS. 4a–4d show, respectively, a front view, a left side view, a right side view and a top view of a termination board to be connected to the above mentioned motherboard;

FIGS. 6a–6d show, respectively, a front view, a left side view, a right side view and a top view of a configuration of the termination board $TB_2$ shown in FIG. 5(a); and FIGS. 7a–7d show, respectively, a front view, a left side view, a right side view and a top view of a configuration of the termination board $TB_3$ shown in FIG. 5(b).

DESCRIPTION OF THE PREFERRED EMBODIMENTS

Figure 1:
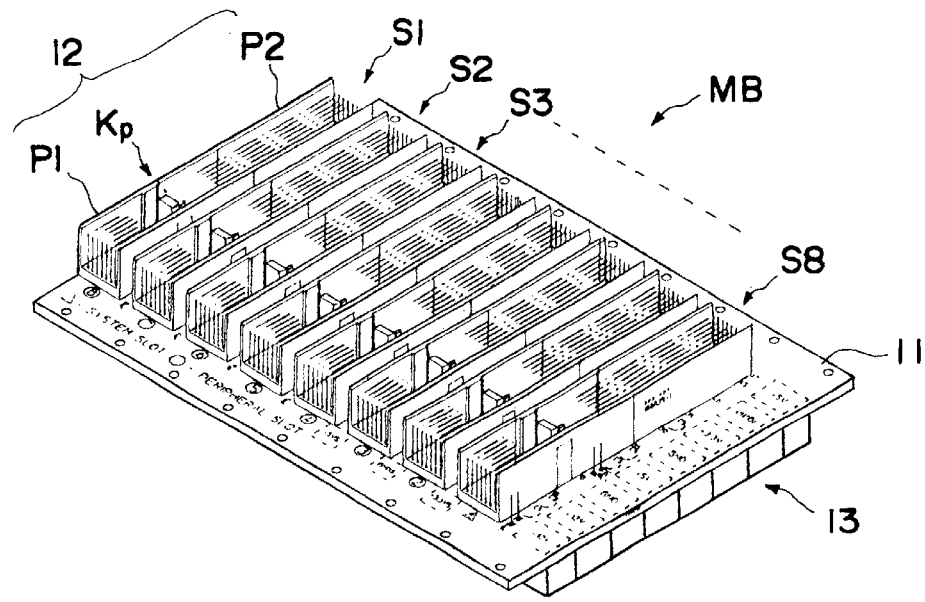
FIG. 1 is a perspective view depicting a configuration of a motherboard in accordance with the present invention.
Figure 2:
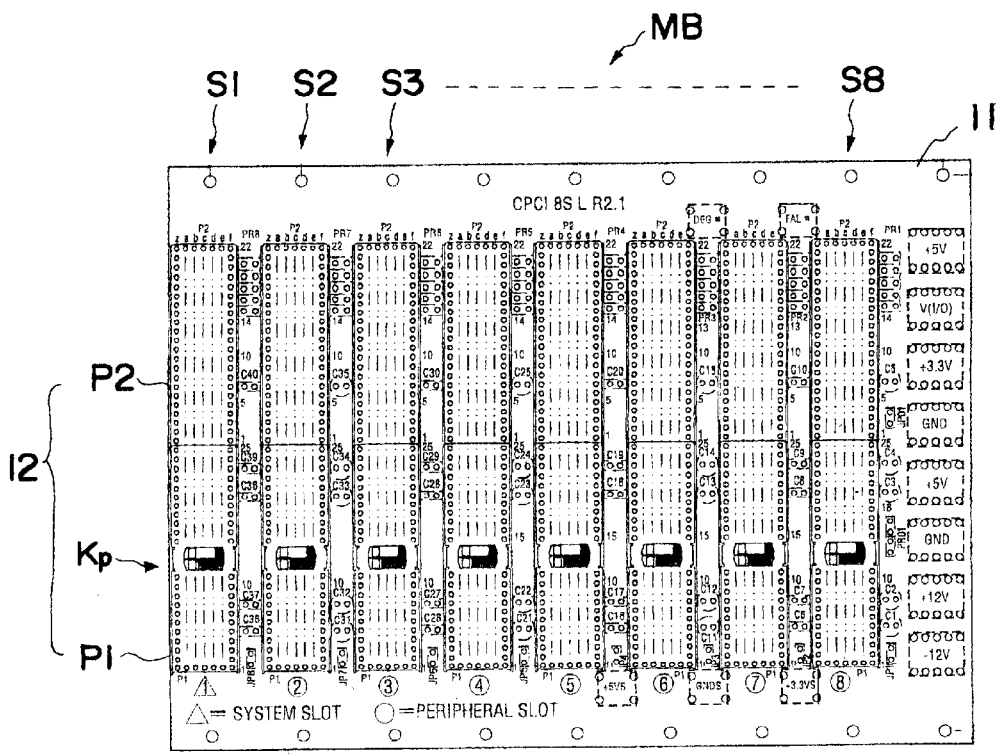
FIG. 2 is a front view of the above mentioned motherboard.

FIG. 1 is a perspective view of a motherboard (motherboard for a CPCI bus) MB in accordance with the present invention, and FIG. 2 is a front view of this motherboard MB. The motherboard MB comprises a printed board 11, plug connectors 12, 12, . . . constituting a plurality of slots for connecting daughter boards (8 slots in this example) installed on the front face side (connector mounting face side) of the board 11, a power supply terminal 13 which is installed on the rear face of the board 11 for receiving supply of a plurality of voltages or for grounding, and such mounted components as a line filter capacitor and jumper pins (not illustrated).

The plug connector 12 constituting each slot S1–S8 comprises a P1 connector having 7 rows laterally×25 levels longitudinally of a pin array, and a P2 connector having 7 rows laterally×22 levels longitudinally of a pin array respectively, which are vertically linked and integrated to be one plug connector, as shown in FIG. 2. In the P1 connector, which is linked at the bottom, the insertion error prevention key $K_P$ is installed using the middle 3 levels out of the longitudinal 25 levels so that a vertically reversed connection is prevented when a daughter board is connected.

The printed board 11 has a layered structure which is comprised of 10 wiring layers, for example, where printed wiring is on each layer, and a bus line, is formed connecting the pin rows of each slot (plug connector) on each layer, such as a GND wiring layer, a bus line wiring layer of a row and c row, and a V (I/O) bus line wiring layer, from the front face side of the board.

On the motherboard for a bus MB structured like this, functional boards (daughter boards) DB according to the system configuration are inserted into respective slots. Such functional boards include a CPU board for controlling the entire system, an I/O board for inputting and outputting with external devices, a memory board for storing specified values of sequences and the system, and a graphic board for performing arithmetic processing to display three-dimensional images. These daughter boards DB communicate with each other via a bus line formed in the printed board 11 of the motherboard MB so as to function as an integrated system.

On the bus line of the motherboard, high-speed and high frequency signals are often transmitted/received on each signal layer, and a high-speed Schottky diode array (terminating resistance) must be installed at the terminating part of the bus line so that reflection of the transmitted high frequency signals does not occur. Because of this, a predetermined rule is defined for the slot insertion positions of the daughter boards DB for the motherboard so as to define the flow direction of the signals. In other words, a CPU board for executing high-speed arithmetic processing and transmitting a reference clock to each daughter board is installed at the most upstream slot, and this slot is defined as the system slot, and the other end, that is the most downstream, is defined as the terminating slot. FIG. 2 shows a motherboard where the left end is the system slot S1, and the right end is the terminating slot S8. The motherboard MB in accordance with the present invention does not have a terminating resistance which is installed next to the terminating slot (S8 in the case of the present embodiment) in a conventional motherboard.

Figure 3:
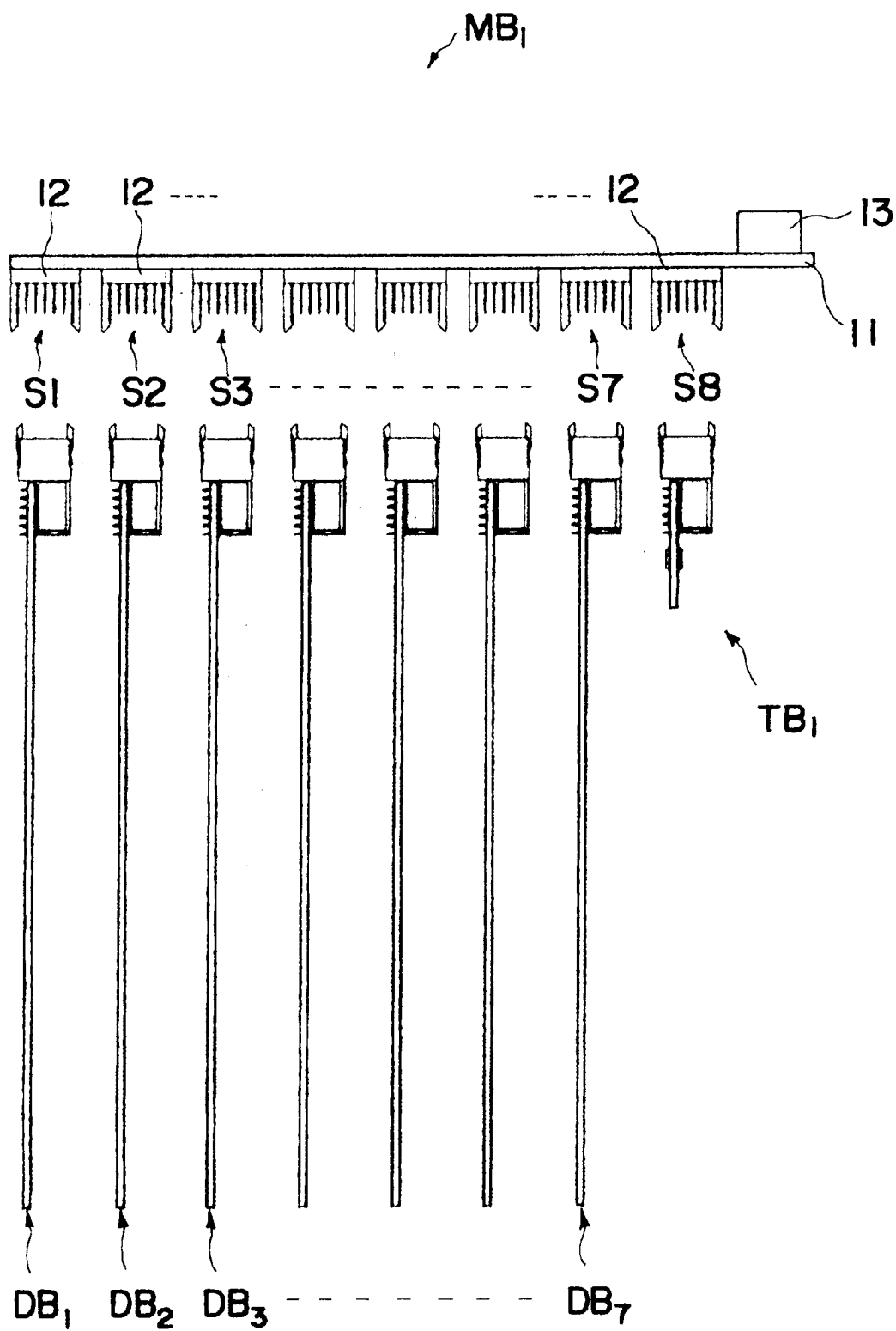
FIG. 3 is a top view depicting a connection status of daughter boards and a termination board to the motherboard in accordance with the present invention.

FIG. 3 is a motherboard $MB_1$ according to the preferred embodiment of the motherboard MB of the present invention, showing a top view of the front view of the motherboard shown in FIG. 2, and the connection relationship with other daughter boards DB. As FIG. 3 shows, the motherboard $MB_1$ constitutes an integrated system by connecting the above mentioned daughter boards $DB_1$–$DB_7$ having various functions into the slots S1–S7 on the motherboard via connectors. In the terminating slot S8 on the motherboard $MB_1$, a termination board $TB_1$, mounting a high-speed Schottky diode, is connected via a connector.

FIG. 4 shows a four side view of the termination board $TB_1$, comprising a receptacle connector 21 which can be connected with plug connectors 12 constituting each slot of the motherboard $MB_1$, and a terminating resistance board 30. The receptacle connector 21 is comprised of a J1 connector having 5 rows laterally×25 levels longitudinally of a contact array and a J2 connector having 5 rows laterally×22 levels longitudinally of a contact array, which are vertically linked and integrated to be a receptacle connector, as shown in FIG. 4. In the J1 connector, which is linked at the bottom, the error insertion prevention key $K_R$ is installed using the middle 3 levels out of the longitudinal 25 levels, and this key $K_R$ is connected with the key $K_P$ installed at the plug connector 12 of the mother board $MB_1$, so that a vertically reversed connection is prevented when the termination board (daughter board) is connected. In each plug connector, the rows at both ends (v row and f row) are pin rows which are not used.

The terminating resistance board 30 comprises a compact printed board 31, high-speed Schottky diodes 32, 32, . . . (U1–U7 in FIG. 4) mounted on this board, and chip capacitors 33, 33, . . . (C1–C9 in FIG. 4), which absorb high frequency signals transmitted to each bus line layer so that end face reflection does not occur. The terminating resistance board 30 is comprised of terminal arrays, the same as other daughter boards, and is installed parallel with other daughter boards $DB_1$–$DB_7$ by being connected with the same receptacle connector 21 by solder, that is, installed perpendicular to the motherboard $MB_1$.

As mentioned above, the mother board $MB_1$ is configured by connecting, via a connector, the termination board $TB_1$, to prevent reflection of the bus line, to the last slot S8 out of the plurality of slots S1–S8 for connecting daughter boards. Therefore, it is unnecessary to install the terminating resistance on the motherboard, and the mounting space on the motherboard can be increased or the size of the motherboard can be decreased. The termination board $TB_1$ is installed parallel with other daughter boards $DB_1$–$DB_7$. So, the termination board $TB_1$ does not interfere with other daughter boards nor does it protrude to the side or in the depth direction of the mother board $MB_1$, which makes it possible to make the system compact.

As the above description shows, the termination board $TB_1$ is installed at the termination side with respect to the other daughter boards. So, when there are five daughter boards, $DB_1$–$DB_6$, which constitute a system, for example, the termination board $TB_1$ can be connected to the slot S8, just like the above embodiment, but also can be connected to the slot S6 or S7. In this way, according to the present embodiment, the flexibility of termination board installation can be expanded by using a receptacle connector 21.

Figure 5A:
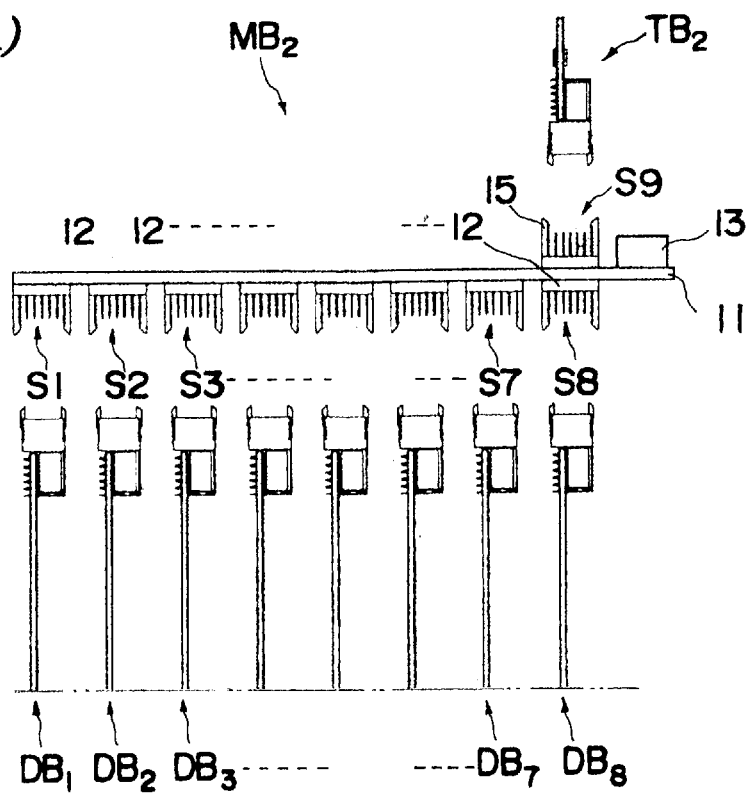
FIG. 5 is a top view depicting a connection status of daughter boards and a termination board to another motherboard in accordance with the present invention.

FIGS. 5(a) and (b) shows a motherboard $MB_2$ which is another preferred embodiment of the motherboard MB in accordance with the present invention, where a top view and the connection relationship with other daughter boards DB are illustrated, just like FIG. 4. As FIGS. 5(a) and (b) show, the motherboard $MB_2$ constitutes an integrated system by connecting the daughter boards $DB_1$–$DB_6$ having the above mentioned functions into the slots S1–S8 on the motherboard via connectors. On the rear face of the motherboard $MB_2$, a plug connector 15 comprising P1 and P2 connectors is installed back-to-back with the plug connector of the terminating slot S8, and is soldered on the motherboard such that the pin array becomes mirror-symmetrical with the slot S8. A termination board $TB_2$ or $TB_3$, for mounting the high-speed Schottky diode array, is connected to the slot S9 via a connector.

FIG. 6 shows a four side view of the termination board $TB_2$ shown in FIG. 5(a), and the termination board $TB_2$ is comprised of a receptacle connector 22 and a terminating resistance board 30 which is the same as the above mentioned embodiment. The receptacle connector 22 is comprised of a J1 connector and a J2 connector, which are the same as the receptacle connector 21 of the above mentioned embodiment. In the receptacle connector 22, J1 and J2 of the receptacle connector 21 are rotated 180° degrees where the center of the rotation is the axis which goes through the center of the connection end face of the connector, and is perpendicular to the connection end face (for J1 connector, this axis is shown by P in FIG. 4 and FIG. 6), and in this state, the receptacle connector 22 is soldered to the terminating resistance board 30 from the direction opposite from the above mentioned embodiment, so as to be an integrated receptacle connector 22.

The receptacle connector 22 and the termination board $TB_2$ configured like this are mirror-symmetrical with the receptacle connector 21 and the terminal board $TB_1$ (or daughter boards) which are installed in the slot S8 on the front face of the motherboard. The P1 and P2 connectors (plug connector 15), which are installed in the slot S9 on the rear face of the motherboard, are also rotated in the same way as the J1 and J2 connectors so that the P1 and P2 connectors are roughly mirror-symmetrical with the plug 12 of the slot S8, maintaining compatibility in key connection.

In the motherboard $MB_2$ configured as above, the slot S9, which is roughly mirror-symmetrical with the slot on the front face of the board, is created on the rear face of the last slot S8, and the termination board $TB_2$, for preventing reflection at the termination of each bus line layer, is connected to the slot S9. Since it is unnecessary to set terminating resistance on the motherboard, the mounting space on the motherboard can be increased, or the size of the motherboard can be decreased. Also, this termination board $TB_2$ is installed on the rear face of the motherboard $MB_2$, therefore all the slots can be effectively used without occupying a slot (S1–S8) on the front face of the motherboard.

Figure 5B:
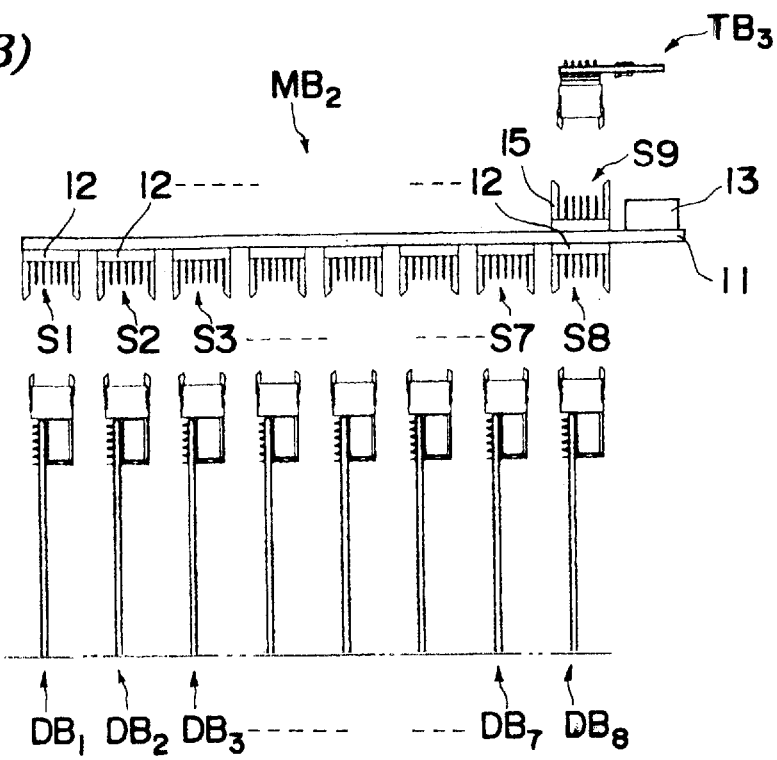

FIG. 7 shows a four side view of the termination board $TB_3$ shown in FIG. 5(b), and the termination board $TB_3$ is comprised of a receptacle connector 23 and a terminating resistance board 30, which is the same as the above mentioned embodiments. The receptacle connector 23 is comprised of a J11 connector and J21 connector, which have the same contact arrays and key arrangement as the above mentioned receptacle connector 22. This receptacle connector 23 is formed on a plane where the connecting plane with the terminating resistance board 30 is perpendicular to the connector connecting axis, and the receptacle connector 23 is soldered to the terminating resistance board 30 so as to be an integrated receptacle connector 23.

The termination board $TB_3$ configured like this is connected with the plug connector 15 of the slot S9 installed on the rear face of the motherboard $MB_2$, so that the terminating resistance board 30 is installed parallel with the motherboard 11, and the motherboard $MB_2$ is configured in this format. Therefore, an effect similar to the embodiments shown in FIG. 5(a) and FIG. 6 can be presented, and the size of the system can be decreased by decreasing the depth in the motherboard rear face direction.

As the above description shows, according to the present invention, the plug connectors 12 and 15 to be installed on the mother board can be configured using the same P1 and P2 connectors in any embodiment, and the terminating resistance board 30 constituting each termination board $TB_1$–$TB_3$ can be configured using the same board. Therefore, a highly flexible motherboard can be provided with a simple and easy configuration according to the system to be configured.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

RELATED APPLICATIONS

This application claims the priority of Japanese Patent Application No. 11-213971 filed on Jul. 28, 1999, which is incorporated herein by reference.

What is claimed is:

1. A motherboard comprising a board, a plurality of connector elements installed on said board, and a bus line which is formed on said board for interconnecting said plurality of connector elements, so as to allow interconnection of a plurality of daughter boards connected to said plurality of connector elements via said bus line, wherein
- a termination board having a terminating resistance to decrease reflection noise of said bus line is connected to a connector element at the last stage of said bus line among said plurality of connector elements;
- one of said plurality of daughterboards being comprised of a CPU board for performing high-speed arithmetic processing and transmitting reference clock signals to each other daughter board, is connected at the most upstream position in said bus line among said plurality of connector elements;
- all said plurality of connector elements to which said daughter boards are connected are installed in a row on the front face of said board and said connector element at the last stage to which said termination board is connected is installed on the rear face of said board and back-to-back on the rear side of said connector element positioned at the last part of said bus line out of said plurality of connector elements installed in a row on the front face of said board.

2. The motherboard according to claim 1 wherein said daughter boards and said termination board extend in a direction perpendicular to said motherboard to be connected to said connector elements and, said connector element to which said termination board is connected and said termination board being mirror-symmetrical with a daughter board and said connector element installed on the front face of said board and positioned at the last part of said bus line.

3. The motherboard according to claim 1 wherein said daughter boards extend in a direction perpendicular to said motherboard to be connected to said connector elements and said termination board extends in a direction parallel with said board to be connected to said connector elements and perpendicular to a connecting axis of said connector element to which said termination board is connected.

* * * * *